United States Patent
Yuki et al.

(10) Patent No.: US 10,366,977 B2
(45) Date of Patent: Jul. 30, 2019

(54) OVERHEAT PROTECTION CIRCUIT, AND SEMICONDUCTOR INTEGRATED CIRCUIT DEVICE AND VEHICLE THEREWITH

(71) Applicant: Rohm Co., Ltd., Kyoto (JP)

(72) Inventors: Hirofumi Yuki, Kyoto (JP); Shuntaro Takahashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 507 days.

(21) Appl. No.: 15/147,135

(22) Filed: May 5, 2016

(65) Prior Publication Data

US 2016/0336309 A1 Nov. 17, 2016

(30) Foreign Application Priority Data

May 11, 2015 (JP) ................. 2015-096464

(51) Int. Cl.
| | |
|---|---|
| *H01L 27/02* | (2006.01) |
| *H01L 29/735* | (2006.01) |
| *H01L 29/06* | (2006.01) |
| *H02H 5/04* | (2006.01) |
| *H02H 7/00* | (2006.01) |

(52) U.S. Cl.
CPC ...... *H01L 27/0259* (2013.01); *H01L 29/0619* (2013.01); *H01L 29/735* (2013.01); *H02H 5/044* (2013.01); *H02H 7/00* (2013.01)

(58) Field of Classification Search
CPC ............. H01L 27/0259; H01L 29/0619; H01L 29/735; H01L 21/822; H01L 27/04; H02H 7/00; H02H 5/044; H02H 5/041; H02H 5/04; H02H 9/04; H02H 3/20; H02H 3/265; H02H 3/32; H02H 3/382; H02H 3/40; G05F 1/573
USPC .......................................................... 361/86
See application file for complete search history.

(56) References Cited

U.S. PATENT DOCUMENTS

| | | | | |
|---|---|---|---|---|
| 4,497,586 | A * | 2/1985 | Nelson ..................... | G01K 7/01 374/163 |
| 4,669,026 | A * | 5/1987 | Widlar ................... | H02H 5/044 323/278 |
| 6,987,655 | B2 * | 1/2006 | Kesler ..................... | F02P 3/051 361/103 |
| 2005/0068707 | A1 * | 3/2005 | Takada ............... | H03K 17/0822 361/103 |
| 2005/0162207 | A1 * | 7/2005 | Kamei ............... | H03K 3/02337 327/205 |

FOREIGN PATENT DOCUMENTS

| | | | |
|---|---|---|---|
| JP | 2004-253936 A | | 9/2004 |
| JP | 2005268703 A | * | 9/2005 |
| JP | 2009-294841 | | 12/2009 |

* cited by examiner

*Primary Examiner* — Thienvu V Tran
*Assistant Examiner* — Nicolas Bellido
(74) *Attorney, Agent, or Firm* — Fish & Richardson P.C.

(57) ABSTRACT

An overheat protection circuit has an NPN transistor, a power terminal to which a supply voltage is applied, a transmission path by which the supply voltage is transmitted from the power terminal to the collector of the NPN transistor without passing through a current source, and an output voltage generator that generates an output voltage commensurate with the base-emitter voltage of the NPN transistor.

11 Claims, 6 Drawing Sheets

| $V_{TSD}$ | STATE |
|---|---|
| Low | NORMAL STATE |
| High | OVERHEATED STATE |

OVERHEAT PROTECTION CIRCUIT, AND SEMICONDUCTOR INTEGRATED CIRCUIT DEVICE AND VEHICLE THEREWITH

This nonprovisional application claims priority under 35 U.S.C. § 119(a) based on Patent Application No. 2015-96464 filed in Japan on May 11, 2015, the entire contents of which are hereby incorporated by reference.

BACKGROUND OF THE INVENTION

1. Field of the Invention

The present invention relates to an overheat protection circuit that detects an overheated state, and also relates to a semiconductor integrated circuit device and a vehicle that incorporate an overheat protection circuit.

2. Description of Related Art

There are conventionally known overheat protection circuits that detect an overheated state on the basis of a division voltage resulting from a reference voltage having a flat temperature response being divided by resistors and the temperature response of the base-emitter voltage of an NPN transistor (see, e.g., Japanese Patent Application Publication No. 2009-294841, paragraph 0040).

Figure 9:
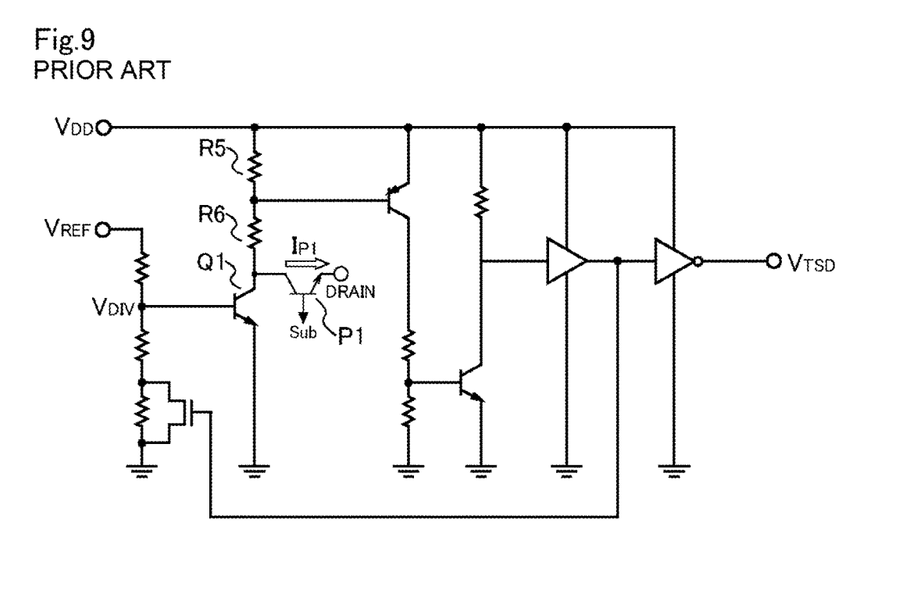
FIG. 9 is a diagram showing one configuration example of a common overheat protection circuit.

FIG. 9 is a diagram showing one configuration example of a common overheat protection circuit. The common overheat protection circuit shown in FIG. 9 is so configured that a division voltage $V_{DIV}$ resulting from a reference voltage $V_{REF}$ having a flat temperature response being divided by resistors is applied to the base of a temperature-detection NPN transistor Q1 and the temperature response of the base-emitter voltage of the NPN transistor Q1 is exploited to detect an overheated state.

Figure 10:
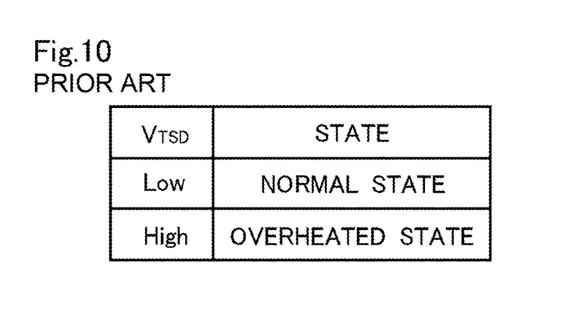
FIG. 10 is a diagram showing a relationship between an output voltage of an overheat protection circuit and a detected state.

As shown in FIG. 10, in a normal state, the output voltage $V_{TSD}$ of the common overheat protection circuit shown in FIG. 9 is at low level and, in an overheated state, the output voltage $V_{TSD}$ of the common overheat protection circuit shown in FIG. 9 is at high level.

However, with the common overheat protection circuit shown in FIG. 9, when a negative current is applied to the output terminal of a monitoring-target power device (e.g., the open drain of an output power MOS transistor), a current $I_{P1}$ is diverted from the collector of the NPN transistor Q1 to the output terminal of the monitoring-target power device via a parasitic transistor P1 that is formed between the collector of the NPN transistor Q1 and the output terminal of the monitoring-target power device, and this causes a voltage drop at the collector of the NPN transistor Q1. When a voltage drop occurs at the collector of the NPN transistor Q1, even when the base-emitter voltage $V_{BE}$ of the NPN transistor Q1 is low, the output voltage $V_{TSD}$ unnecessarily turns to high level.

That is, with the common overheat protection circuit shown in FIG. 9, when a negative current is applied to the output terminal of a monitoring-target power device (e.g., the open drain of an output power MOS transistor), an overheated state is erroneously detected despite in a normal state.

Thus, the common overheat protection circuit shown in FIG. 9 has low resistance to a negative current that can be applied to the output terminal of a monitoring-target power device, and tends to have a low immunity to noise.

SUMMARY OF THE INVENTION

An object of the present invention is to provide an overheat protection circuit that can prevent malfunction occurring when a negative current is applied to the output terminal of a monitoring-target power device, and to provide a semiconductor integrated circuit device and a vehicle that incorporate such an overheat protection circuit.

To achieve the above object, according to one aspect of the present invention, an overheat protection circuit includes: an NPN transistor; a power terminal to which a supply voltage is applied; a transmission path by which the supply voltage is transmitted from the power terminal to the collector of the NPN transistor without passing through a current source; and an output voltage generator that generates an output voltage commensurate with the base-emitter voltage of the NPN transistor.

The significance and effect of the present invention will become clear from the description of embodiments that follows. It should however be understood that the embodiments disclosed herein are merely examples of how the present invention can be implemented, and that the meanings of the terms referring to various elements and features of the present invention are not limited to those in which those terms are used in the following description of embodiments.

DETAILED DESCRIPTION OF PREFERRED EMBODIMENTS

Figure 1:
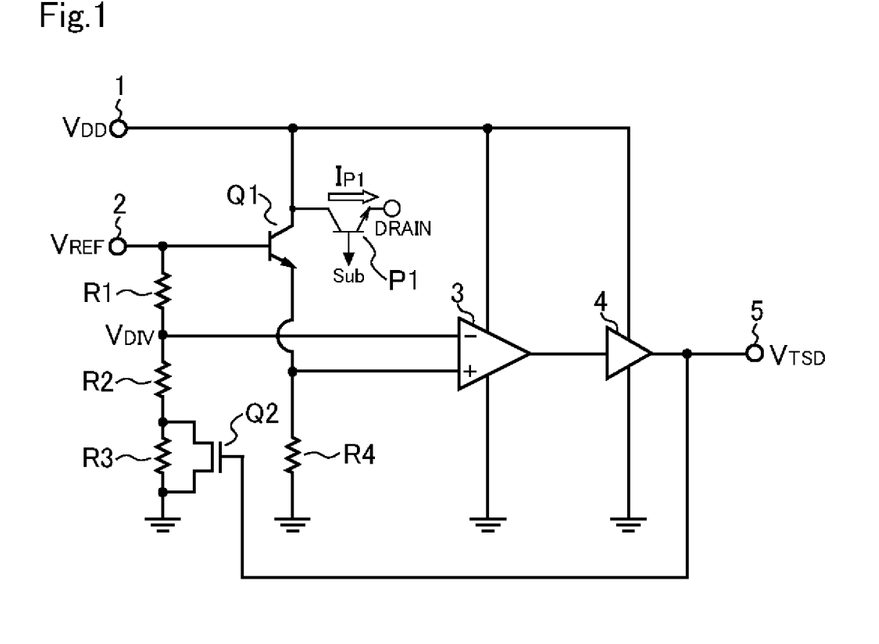
FIG. 1 is a diagram showing one configuration example of an overheat protection circuit.

Overheat Protection Circuit:

FIG. 1 is a diagram showing one configuration example of an overheat protection circuit. The overheat protection circuit shown in FIG. 1 includes a power terminal 1, a reference voltage terminal 2, an operational amplifier 3, a buffer 4, an output terminal 5, an NPN transistor Q1, a MOS transistor Q2, and resistors R1 to R4.

A supply voltage $V_{DD}$ is applied to the power terminal 1. The supply voltage $V_{DD}$ is a voltage that is supplied from outside a semiconductor integrated circuit device that includes the overheat protection circuit shown in FIG. 1, and is used as a supply voltage for the semiconductor integrated circuit device.

A reference voltage $V_{REF}$ is applied to the reference voltage terminal 2. The reference voltage $V_{REF}$ is a voltage that has a flat temperature response, and can be, for example, a band gap reference voltage generated by a band gap reference voltage source provided within the semiconductor integrated circuit device that includes the overheat protection circuit shown in FIG. 1.

The power terminal 1 is connected to a collector of the NPN transistor Q1, to a power terminal of the operational amplifier 3, and to a power terminal of the buffer 4. Ground terminals of the operational amplifier 3 and of the buffer 4 are held at a ground potential. The operational amplifier 3 and the buffer 4 each operate by using, as its driving voltage, the difference between the supply voltage $V_{DD}$ and the ground potential.

The reference voltage terminal 2 is connected to a base of the NPN transistor Q1 and to one end of the resistor R1. Another end of the resistor R1 is connected to one end of the resistor R2, another end of the resistor R2 is connected to one end of the resistor R3, and another end of the resistor R3 is held at the ground potential. To a connection node between the resistors R1 and R2, an inverting input terminal of the operational amplifier 3 is connected. With the resistor R3, the MOS transistor Q2 is connected in parallel.

An emitter of the NPN transistor Q1 is connected to one end of the resistor R4, and another end of the resistor R4 is held at the ground potential. Thus, the resistor R4 serves as a current source for the NPN transistor Q1. To a connection node between the NPN transistor Q1 and the resistor R4, a non-inverting input terminal of the operational amplifier 3 is connected.

An output terminal of the operational amplifier 3 is connected to an input terminal of the buffer 4, and an output terminal of the buffer 4 is connected to the output terminal 5 and to a gate of the MOS transistor Q2.

Figure 2:
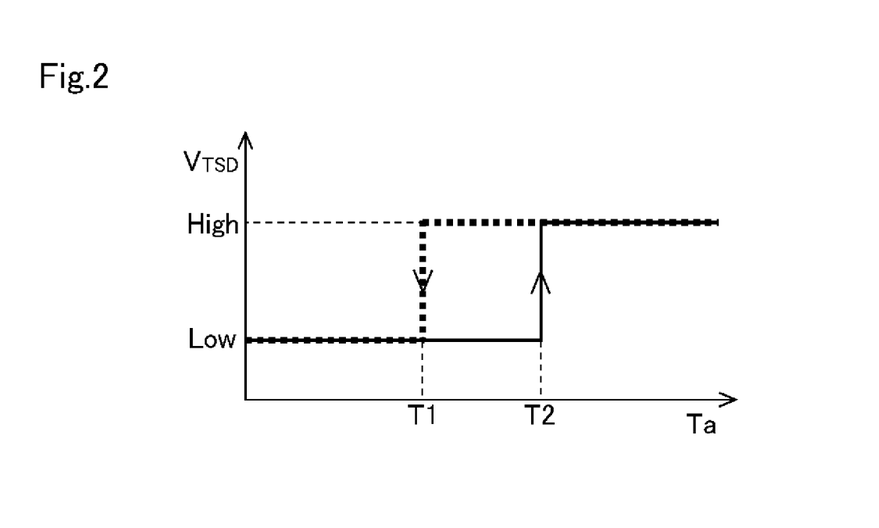
FIG. 2 is a diagram showing a relationship between an output voltage of an overheat protection circuit and an ambient temperature around the overheat protection circuit.

The operation of the overheat protection circuit configured as described above will now be described with reference to FIGS. 2 and 10. FIG. 2 is a diagram showing a relationship between an output voltage $V_{TSD}$ of the overheat protection circuit and an ambient temperature Ta around the overheat protection circuit.

The base-emitter voltage $V_{BE}$ of the NPN transistor Q1 has a positive temperature response. Thus, the higher the ambient temperature Ta, the higher the collector current of the NPN transistor Q1, and accordingly the higher the voltage that is applied to the non-inverting input terminal of the operational amplifier 3.

A voltage division circuit composed of the resistors R1 to R3 and the MOS transistor Q2 generates a division voltage $V_{DIV}$ of the reference voltage $V_{REF}$. The division voltage $V_{DIV}$ generated by the voltage division circuit is applied to the inverting input terminal of the operational amplifier 3. When the MOS transistor Q2 is ON, the division voltage $V_{DIV}$ is generated in a voltage division ratio that depends on the ratio of the resistance value of the resistor R1 to that of the resistor R2. On the other hand, when the MOS transistor Q2 is OFF, the division voltage $V_{DIV}$ is generated in a voltage division ratio that depends on the ratio of the resistance value of the resistor R1 to the composite resistance value of the resistors R2 and R3. Thus, the division voltage $V_{DIV}$ has a higher value when the MOS transistor Q2 is OFF than when the MOS transistor Q2 is ON.

In this embodiment, the circuit constants of the NPN transistor Q1 and the resistors R1 to R4 are so set that, when the MOS transistor Q2 is OFF and in addition the ambient temperature Ta around the overheat protection circuit equals T2 (e.g., 175° C.), the voltage applied to the non-inverting input terminal of the operational amplifier 3 and the voltage (division voltage $V_{DIV}$) applied to the inverting input terminal of the operational amplifier 3 are equal and, when the MOS transistor Q2 is ON and in addition the ambient temperature Ta around the overheat protection circuit equals T1 (e.g., 150° C.) lower than T2, the voltage applied to the non-inverting input terminal of the operational amplifier 3 and the voltage (division voltage $V_{DIV}$) applied to the inverting input terminal of the operational amplifier 3 are equal.

The operational amplifier 3 outputs via its output terminal a high-level voltage when the voltage applied to its non-inverting input terminal is equal to or higher than the voltage applied to its inverting input terminal, and outputs via its output terminal a low-level voltage when the voltage applied to its non-inverting input terminal is lower than the voltage applied to its inverting input terminal.

The buffer 4 receives an output voltage of the operational amplifier 3, and outputs a voltage $V_{TSD}$, which holds the logic level of the output voltage of the operational amplifier 3, to the output terminal 5 and the gate of the MOS transistor Q2. The MOS transistor Q2 is OFF when the voltage $V_{TSD}$ is at low level, and is ON when the voltage $V_{TSD}$ is at high level.

Accordingly, if the ambient temperature Ta around the overheat protection circuit rises above T2, at the time point that the ambient temperature Ta around the overheat protection circuit reaches T2, the voltage $V_{TSD}$ turns from low level to high level. After the voltage $V_{TSD}$ turns to high level, unless the ambient temperature Ta around the overheat protection circuit falls below T1, the voltage $V_{TSD}$ remains at high level. When the ambient temperature Ta around the overheat protection circuit falls below T1, the voltage $V_{TSD}$ turns from high level to low level.

As a result, as shown in FIG. 10, in a normal state, the output voltage $V_{TSD}$ of the overheat protection circuit shown in FIG. 1 is at low level; in an overheated state, the output voltage $V_{TSD}$ of the overheat protection circuit shown in FIG. 1 is at high level. Hysteresis can be introduced in the detection of an overheated state.

In the overheat protection circuit shown in FIG. 1, as in a common overheat protection circuit as shown in FIG. 9, when a negative current is applied to an output terminal of a monitoring-target power device (e.g., an open drain of an output power MOS transistor), a current $I_{P1}$ is diverted from the collector of the NPN transistor Q1 via a parasitic transistor P1 that is formed between the collector of the NPN transistor Q1 and the output terminal of the monitoring-target power device.

However, the current capacity of the power source that generates the supply voltage $V_{DD}$ for the semiconductor integrated circuit device is far higher than the current capacity of resistors R5 and R6 that function as a current source for the NPN transistor Q1 in the common overheat protection circuit shown in FIG. 9. Thus, with the overheat protection circuit shown in FIG. 1, it is possible to prevent a voltage drop at the collector of the NPN transistor Q1.

In this way, it is possible to prevent erroneous detection of an overheated state despite in a normal state when a negative current is applied to the output terminal of the monitoring-target power device. Moreover, the overheat protection circuit shown in FIG. 1 has higher resistance to a negative current that can be applied to the output terminal of the monitoring-target power device; it thus has a higher immunity to noise as measured by a BCI (bulk current injection) test.

Figure 3:
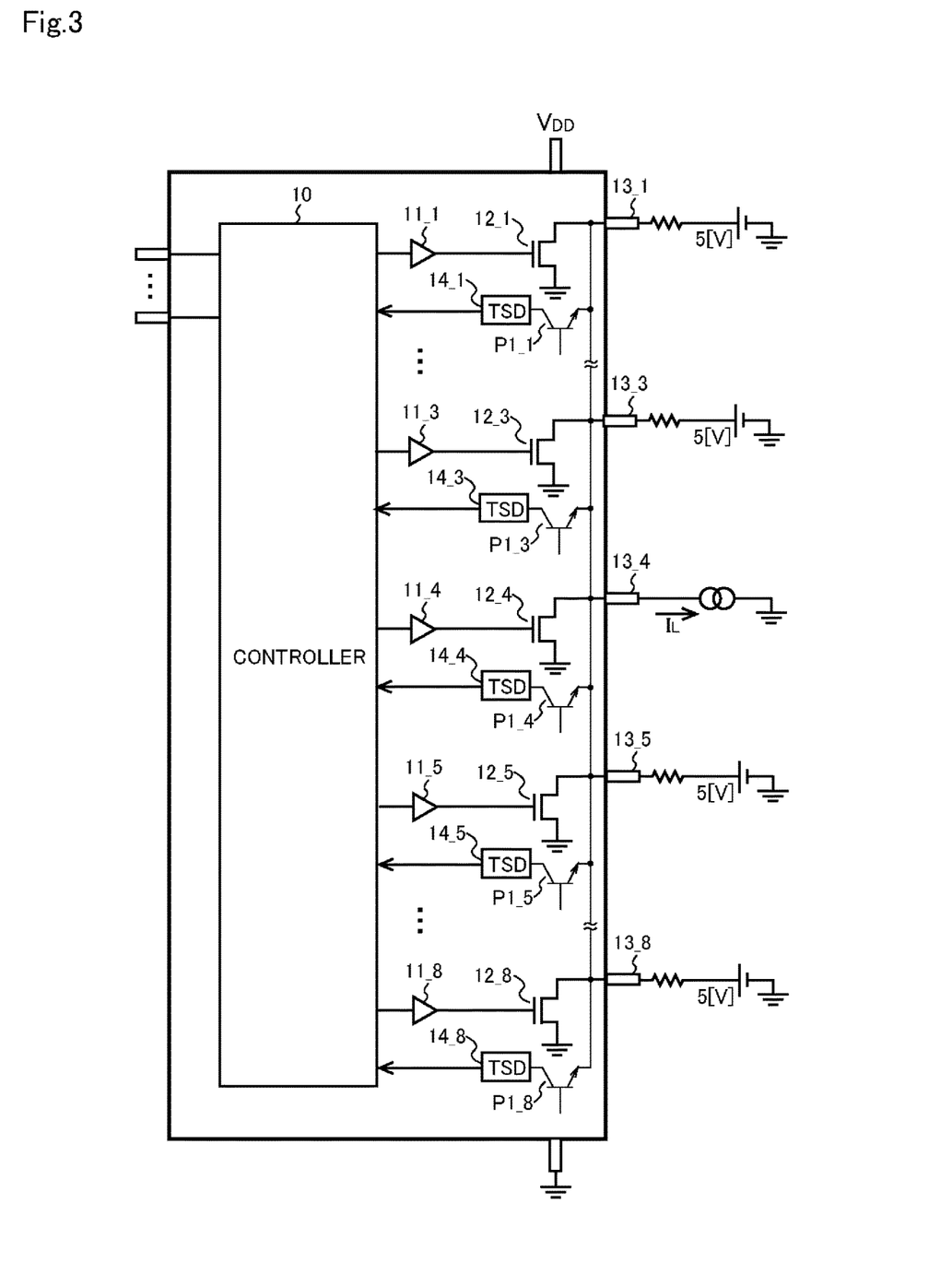
FIG. 3 is a diagram showing one configuration example of a semiconductor integrated circuit device.

Semiconductor Integrated Circuit Device:

To confirm the effect mentioned above, measurement was performed with a semiconductor integrated circuit device shown in FIG. 3. The semiconductor integrated circuit device shown in FIG. 3 is an eight-channel-output semiconductor integrated circuit device, and includes a controller 10 that generates ON/OFF control signals for power MOS transistors 12_1 to 12_8; pre-drivers 11_n (where n is a natural number from 1 to 8) that generate gate voltages for the power MOS transistors 12_n in response to the ON/OFF control signals for the power MOS transistors 12_n; output pins 13_n (where n is a natural number from 1 to 8) that are electrically connected to drains of the power MOS transistors 12_n; and overheat protection circuits 14_n (where n is a natural number from 1 to 8) that monitor the power MOS transistors 12_n for overheating. The semiconductor integrated circuit device shown in FIG. 3 further includes a band gap reference voltage source that generates the reference voltage $V_{REF}$, channel-1 to channel-8 overcurrent protection circuits, channel-1 to channel-8 open-load detection circuits, etc.

In the semiconductor integrated circuit device shown in FIG. 3, the output voltages of the overheat protection circuits cannot be measured directly; they were instead measured in the following manner. First, as shown in FIG. 3, a negative current $I_L$ was applied to the channel-4 output pin 13_4, and to each of the channel-1 to channel-3 and channel-5 to channel-8 output pins 13_1 to 13_3 and 13_5 to 13_8, one end of a load resistor was connected, with a constant voltage (5 V) applied to another end of the load resistor. Then, while the channel-4 power MOS transistor 12_4 alone was left OFF, the channel-1 to channel-3 and channel-5 to channel-8 power MOS transistors 12_1 to 12_3 and 12_5 to 12_8 were turned ON. Then, while the value of the negative current $I_L$ was varied, the voltage $V_{OUT3}$ output from the channel-3 output pin 13_3 and the voltage $V_{OUT5}$ output from the channel-5 output pin 13_5 were measured. Here, the reason that the voltage $V_{OUT3}$ output from the channel-3 output pin 13_3 and the voltage $V_{OUT5}$ output from the channel-5 output pin 13_5 were measured was that, since a negative current was applied to the channel-4 output pin 13_4, measuring the voltage output from the channel-4 output pin 13_4 was troublesome; it was more convenient to measure the neighboring channel-3 and channel-5 output voltages $V_{OUT3}$ and $V_{OUT5}$ instead.

Figure 4:
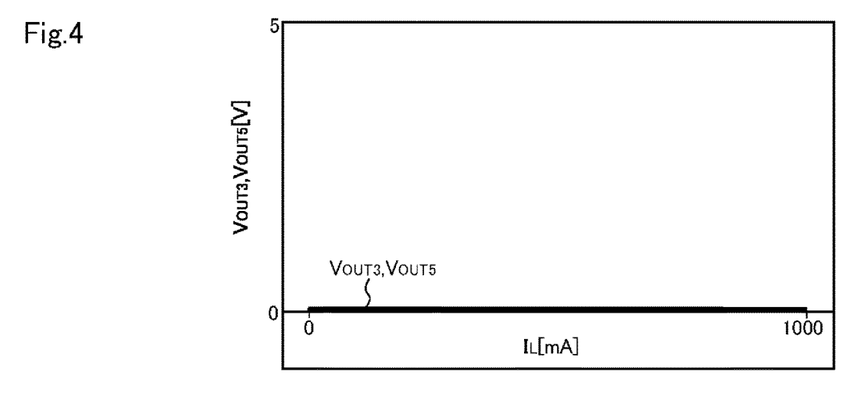
FIG. 4 is a diagram showing output voltage measurement results with the semiconductor integrated circuit device shown in FIG. 3 incorporating overheat protection circuits configured like the overheat protection circuit shown in FIG. 1.

FIG. 4 shows the measurement results with the semiconductor integrated circuit device shown in FIG. 3 with the overheat protection circuits 14_1 to 14_8 each configured like the overheat protection circuit shown in FIG. 1. As shown in FIG. 4, even when the negative current $I_L$ applied to the channel-4 output pin 13_4 was increased up to 1000 mA, the voltages $V_{OUT3}$ and $V_{OUT5}$ output from the channel-3 and channel-5 output pins 13_3 and 13_5 were approximately zero. It was thus confirmed that the channel-3 and channel 5 power MOS transistors remained ON, indicating that the overheat protection circuits 14_3 and 14_5 did not malfunction.

Figure 5A:
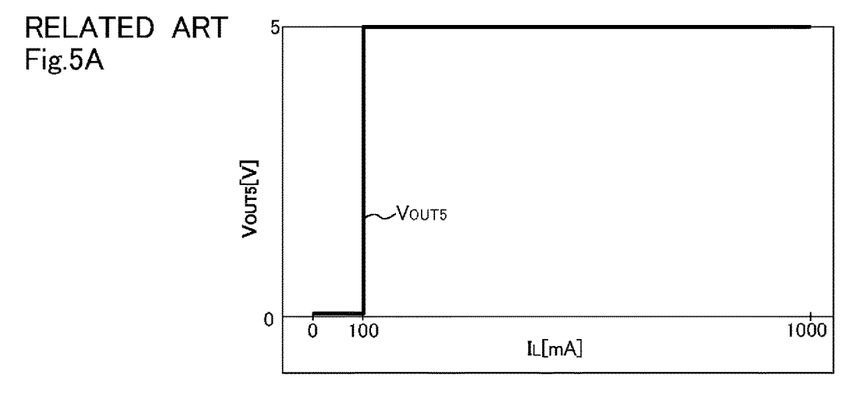
FIG. 5A is a diagram showing output voltage measurement results with the semiconductor integrated circuit device shown in FIG. 3 incorporating overheat protection circuits configured like a common overheat protection circuit as shown in FIG. 9.
Figure 5B:
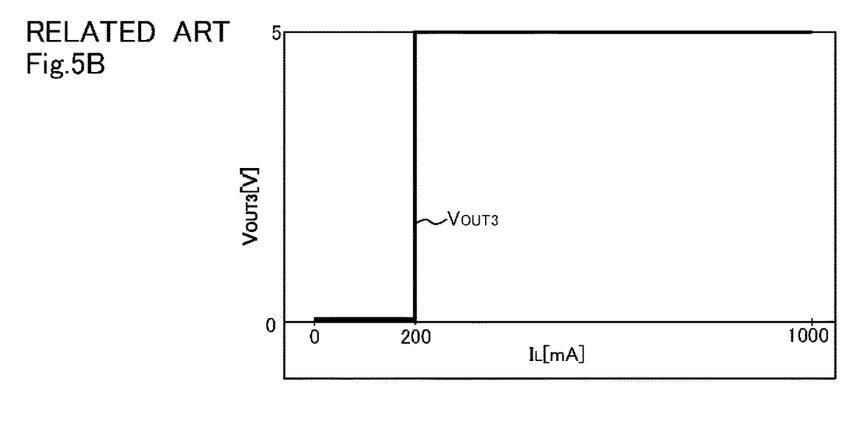
FIG. 5B is a diagram showing output voltage measurement results with the semiconductor integrated circuit device shown in FIG. 3 incorporating overheat protection circuits configured like a common overheat protection circuit as shown in FIG. 9.

FIGS. 5A and 5B show the measurement results with, as a comparative example, the semiconductor integrated circuit device shown in FIG. 3 with the overheat protection circuits 14_1 to 14_8 each configured like the common overheat protection circuit shown in FIG. 9.

As shown in FIG. 5A, when the negative current $I_L$ applied to the channel-4 output pin 13_4 was increased up to 100 mA, the voltage $V_{OUT5}$ output from the channe-5 output pin 13_5 increased to 5 V. This indicated that the channel-5 power MOS transistor 12_5 turned from ON to OFF, and it was thus confirmed that the overheat protection circuit 14_5 malfunctioned. Likewise, as shown in FIG. 5B, when the negative current $I_L$ applied to the channel-4 output pin 13_4 was increased up to 200 mA, the voltage $V_{OUT3}$ output from the channe-3 output pin 13_3 increased to 5 V. This indicated that the channel-3 power MOS transistor 12_3 turned from ON to OFF, and it was thus confirmed that the overheat protection circuit 14_3 malfunctioned.

Figure 6:
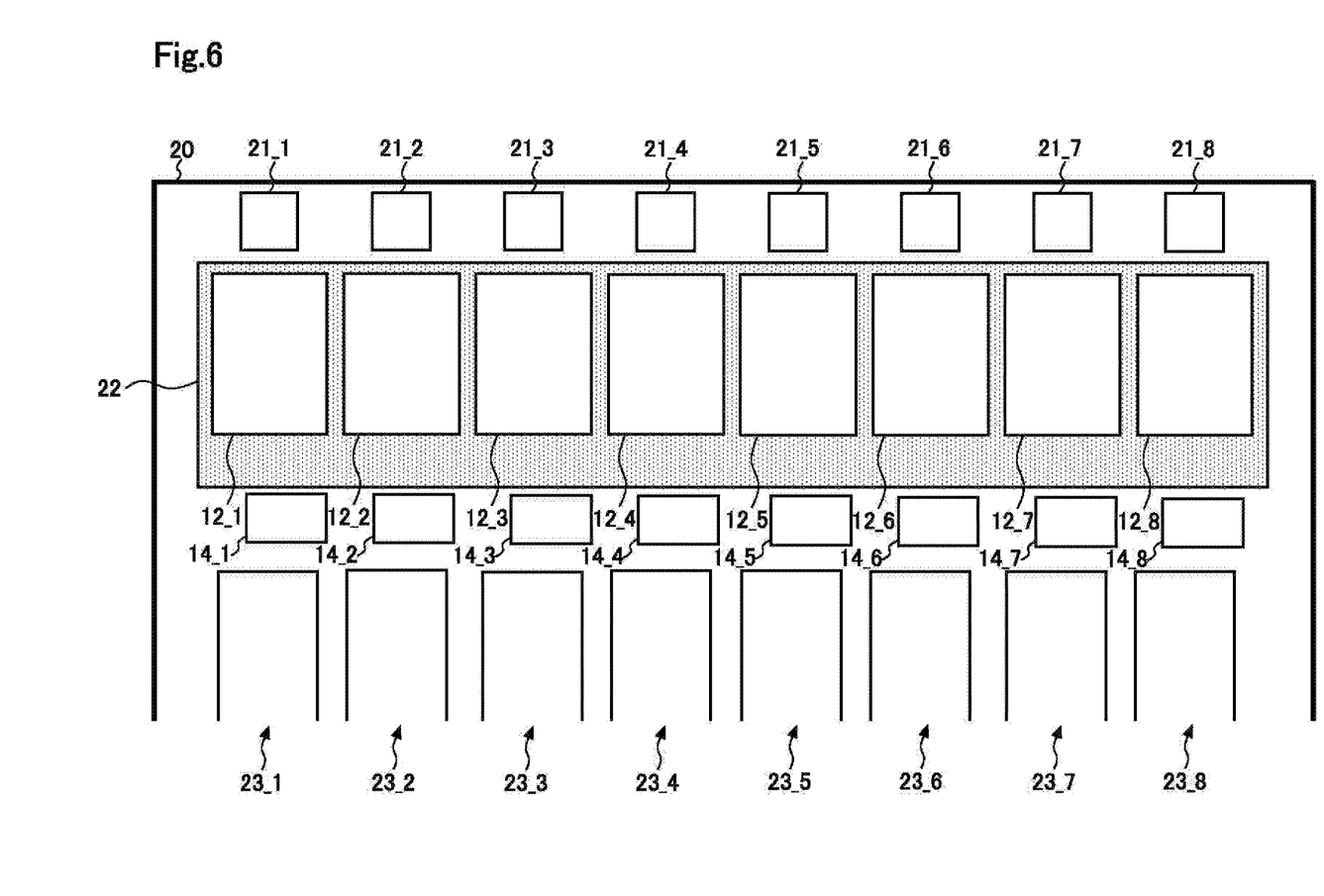
FIG. 6 is a diagram showing a circuit layout in an end part of a semiconductor chip.

Semiconductor Chip Circuit Layout:

FIG. 6 is a diagram showing a circuit layout in an end part of a semiconductor chip. The semiconductor chip is provided within the semiconductor integrated circuit device shown in FIG. 3 with the overheat protection circuits 14_1 to 14_8 each configured like the overheat protection circuit shown in FIG. 1.

In a peripheral part of the semiconductor chip 20, channel-1 to channel-8 output pads 21_1 to 21_8 are formed. The channel-n output pad 21_n (where n is a natural number from 1 to 8) is connected to the channel-n output pin 13_n (where n is a natural number from 1 to 8) shown in FIG. 3 by a bonding wire.

Between the channel-n output pad 21_n (where n is a natural number from 1 to 8) and the channel-n overheat protection circuit 14_ n (where n is a natural number from 1 to 8), the channel-n power MOS transistor 12_n (where n is a natural number from 1 to 8) is arranged. The channel-1 to channel-8 power MOS transistors 12_1 to 12_8 are each surrounded by a guard ring region 22.

With respect to the channel-n overheat protection circuit 14_n (where n is a natural number from 1 to 8), the channel-n overcurrent protection circuit 23_n (where n is a natural number from 1 to 8) is arranged on the opposite side from the channel-n power MOS transistor 12_n (where n is a natural number from 1 to 8). Likewise, with respect to the channel-n overheat protection circuit 14_n (where n is a natural number from 1 to 8), the controller 10, which is not shown in FIG. 6, is arranged on the opposite side from the channel-n power MOS transistor 12_n (where n is a natural number from 1 to 8). The channel-n overcurrent protection circuit 23_n (where n is a natural number from 1 to 8) includes the pre-driver 11_n (where n is a natural number from 1 to 8), which is not shown in FIG. 6.

In the circuit layout described above, the temperature-detection NPN transistor Q1 provided in the overheat protection circuit can be arranged near the power MOS transistor that acts as a heat source. It is thus possible to detect more accurately whether or not the power MOS transistor that acts as a heat source is in a normal state or in an overheated state.

However, the closer the overheat protection circuit is arranged to the power MOS transistor that acts as a heat source, the higher the h parameter fife of the parasitic transistor P1 that is formed between the temperature-detection NPN transistor Q1 in the overheat protection circuit and the drain of the power MOS transistor, and thus the more current tends to pass via the parasitic transistor P1.

In this respect, the overheat protection circuit shown in FIG. 1 can prevent malfunction even if a current passes via the parasitic transistor P1 from the temperature-detection NPN transistor Q1 in the overheat protection circuit to the drain of the power MOS transistor, and thus a high h parameter hfe of the parasitic transistor P1 does not matter. Thus, even when the overheat protection circuit is arranged near the power MOS transistor that acts as a heat source, a high immunity to noise is obtained.

Moreover, in the circuit layout shown in FIG. 6, the channel-1 to chanel-8 power MOS transistors 12_1 to 12_8 are each surrounded by a guard ring region 22, and this helps suppress an increase in the h parameter hfe of the parasitic transistor P1. Thus, a higher immunity to noise is obtained.

Figure 7:
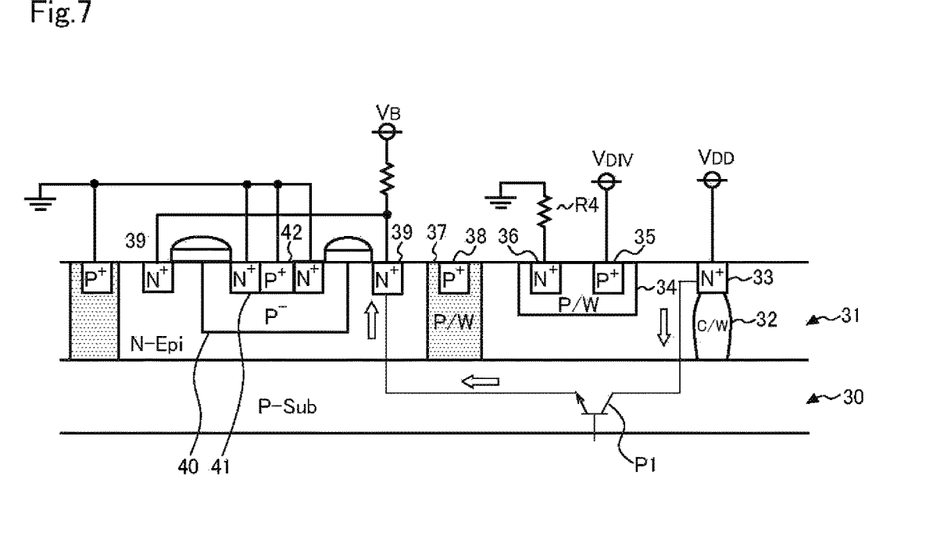
FIG. 7 is a vertical sectional structure diagram of a semiconductor substrate.

Vertical Sectional Structure of a Semiconductor Substrate:

FIG. 7 is a diagram showing a vertical sectional structure of a semiconductor substrate in a region where a power MOS transistor, a guard ring region 22, and a temperature-detection NPN transistor in an overheat protection circuit are formed in the semiconductor chip 20 shown in FIG. 6. On a P-type semiconductor substrate 30, an N-type epitaxial growth layer 31 is formed.

In the N-type epitaxial growth layer 31, a high-concentration N-type layer is formed as a collector wall 32, and on top of the collector wall 32, a high-density N-type region 33 is formed that serves as the collector of the temperature-detection NPN transistor.

Moreover, in the N-type epitaxial growth layer 31, at a distance from the high-density N-type region 33 in the horizontal direction, a P-type well 34 is formed. In the P-type well 34, there are formed a high-concentration P-type region 35, which serves as the base of the temperature-detection NPN transistor, and a high-density N-type region 36, which serves as the emitter of the temperature-detection NPN transistor.

Also formed in the N-type epitaxial growth layer 31 is a P-type well 37 that serves as a guard ring region. In the P-type well 37, a high-density P-type region 38 is formed, and the high-density P-type region 38 is held at the ground potential.

In a region inside the N-type epitaxial growth layer 31 that is surrounded in a ring shape by the P-type well 37 as seen in a top view, there are formed a high-density N-type region 39, which serves as the drain of the power MOS transistor, and a low-density P-type well 40. In the low-density P-type well 40, there are formed a high-density N-type region 41 and a high-density P-type region 42, which serve as the source of the power MOS transistor.

On top of the N-type epitaxial growth layer 31, between the high-density N-type region 39 and the high-density N-type region 41, a gate oxide film and a gate electrode are formed. Also formed on top of the N-type epitaxial growth layer 31 are an aluminum wiring layer and an insulating layer, which constitute the connection paths shown in FIG. 7.

When the voltage $V_B$ shown in FIG. 7 falls to a negative value, a negative current is applied to the drain of the power MOS transistor; thus, a current passes via the parasitic transistor P1 from the collector of the temperature-detection NPN transistor to the drain of the power MOS transistor.

However, as described above, with the overheat protection circuit shown in FIG. 1, it is possible to prevent malfunction even if a current passes via the parasitic transistor P1 from the temperature-detection NPN transistor in the overheat protection circuit to the drain of the power MOS transistor.

Figure 8:
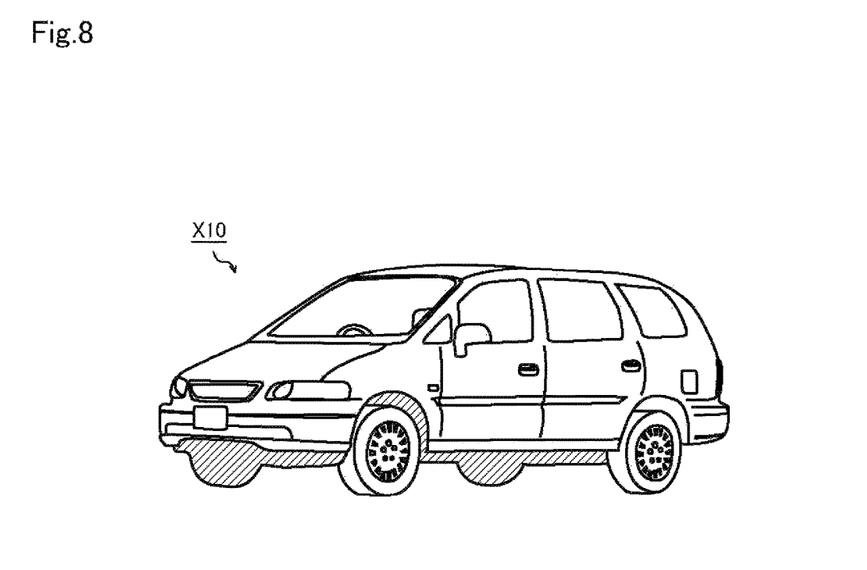
FIG. 8 is a diagram showing an exterior appearance of a vehicle.

Application:

The semiconductor integrated circuit device described above can be suitably used as a low-side switch for driving an inductive load, such as a relay, solenoid, or DC motor, in various ECUs (electronic control units) incorporated in a vehicle X10 as shown in FIG. 8, in consumer appliances, and in industrial appliances.

On the other hand, the overheat protection circuit shown in FIG. 1 finds applications not only in low-side switches but in semiconductor integrated circuit devices in general where a negative current is likely to be applied to an output terminal.

Modifications:

Various technical features disclosed herein can be implemented in any manner other than specifically described above, and allow for many modifications within the spirit of the technical ingenuity involved. For example, the logic levels of the output signal from the overheat protection circuit may be inverted. That is, it should be understood that the embodiments disclosed herein are in every aspect illustrative and not restrictive, and that the technical scope of the present invention is defined not by the description of embodiments given above but by the scope of the appended claims and encompasses any modification in the sense and scope equivalent to those of the claims.

Synopsis:

According to one aspect of the present invention, as described above, an overheat protection circuit includes: an NPN transistor; a power terminal to which a supply voltage is applied; a transmission path by which the supply voltage is transmitted from the power terminal to the collector of the NPN transistor without passing through a current source; and an output voltage generator that generates an output voltage commensurate with the base-emitter voltage of the NPN transistor (a first configuration).

In the overheat protection circuit of the first configuration described above, there may be further provided a current source that is connected to the emitter of the NPN transistor (a second configuration).

In the overheat protection circuit of the first or second configuration described above, there may be further provided with a voltage divider that divides a reference voltage, the reference voltage may be applied to the base of the NPN transistor, and the output voltage generator may include a comparator that compares the emitter voltage of the NPN transistor with a division voltage of the reference voltage output from the voltage divider (a third configuration).

According to another aspect of the present invention, as described above, a semiconductor integrated circuit device includes: a power device; and an overheat protection circuit of any one of the first to third configurations described above (a fourth configuration).

In the semiconductor integrated circuit device of the fourth configuration described above, the NPN transistor and the power device may be formed on a single semiconductor substrate (a fifth configuration).

In the semiconductor integrated circuit device of the fifth configuration described above, the NPN transistor and the power device may be arranged next to each other (a sixth configuration).

In the semiconductor integrated circuit device of the sixth configuration described above, a guard ring region that surrounds the power device may be formed on the semiconductor substrate (a seventh configuration).

In the semiconductor integrated circuit device of any one of the fourth to seventh configurations described above, the power device may be a MOS transistor, there may be further provided a controller that generates an ON/OFF control signal for the MOS transistor and a pre-driver that generates a gate voltage for the MOS transistor in response to the ON/OFF control signal, and the overheat protection circuit may be arranged between, at one end, the MOS transistor and, at the other end, the controller and the pre-driver (an eighth configuration).

In the semiconductor integrated circuit device of any one of the fourth to eighth configurations described above, the supply voltage may be supplied to the semiconductor integrated circuit device from outside the semiconductor integrated circuit device, and the reference voltage may be generated within the semiconductor integrated circuit device (a ninth configuration).

According to yet another aspect of the present invention, as described above, a vehicle includes a semiconductor integrated circuit device of any one of the fourth to ninth configurations described above (a tenth configuration).

What is claimed is:

1. An overheat protection circuit, comprising:
a NPN transistor;
a power terminal to which a supply voltage is applied;
a transmission path by which the supply voltage is transmitted from the power terminal to a collector of the NPN transistor without passing through a current source;
a voltage divider operable to divide a reference voltage in a voltage division ratio to generate a division voltage, the voltage divider including a switch operable to change the voltage division ratio; and
a comparator operable to compare an emitter voltage of the NPN transistor with the division voltage to switch an output voltage from a normal state to an overheated state, and vice versa, wherein
the switch is operable to be turned on/off in response to the switching of the output voltage between the normal state and the overheated state to change the division voltage.

2. The overheat protection circuit of claim 1, further comprising:
the current source that is connected to the emitter of the NPN transistor.

3. The overheat protection circuit of claim 1, wherein
the reference voltage is applied to a base of the NPN transistor.

4. A semiconductor integrated circuit device, comprising:
a power device; and
the overheat protection circuit of claim 1.

5. The semiconductor integrated circuit device of claim 4, wherein the NPN transistor and the power device are formed on a single semiconductor substrate.

6. The semiconductor integrated circuit device of claim 5, wherein
the NPN transistor and the power device are arranged next to each other.

7. The semiconductor integrated circuit device of claim 6, wherein a guard ring region that surrounds the power device is formed on the semiconductor substrate.

8. A semiconductor integrated circuit device comprising:
a power device; and
an overheat protection circuit including:
a NPN transistor;
a power terminal to which a supply voltage is applied;
a transmission path by which the supply voltage is transmitted from the power terminal to a collector of the NPN transistor without passing through a current source; and
an output voltage generator operable to generate an output voltage commensurate with a base-emitter voltage of the NPN transistor, wherein
the power device is a MOS transistor,
the semiconductor integrated circuit device further comprises:
a controller operable to generate an ON/OFF control signal for the MOS transistor; and
a pre-driver operable to generate a gate voltage for the MOS transistor in response to the ON/OFF control signal, and
the overheat protection circuit is arranged between, at one end, the MOS transistor and, at another end, the controller and the pre-driver.

9. The semiconductor integrated circuit device of claim 4, wherein
the supply voltage is supplied to the semiconductor integrated circuit device from outside the semiconductor integrated circuit device, and
the reference voltage is generated within the semiconductor integrated circuit device.

10. A vehicle comprising:
the semiconductor integrated circuit device of claim 4.

11. A semiconductor integrated circuit device, comprising:
an overheat protection circuit including:
a NPN transistor;
a power terminal to which a supply voltage is applied;
a transmission path by which the supply voltage is transmitted from the power terminal to a collector of the NPN transistor without passing through a current source; and
an output voltage generator operable to generate an output voltage commensurate with a base-emitter voltage of the NPN transistor;
a power device;
a controller operable to generate an ON/OFF control signal for the power device; and
a pre-driver operable to generate a gate voltage for the power device in response to the ON/OFF control signal, wherein
the power device and the controller is arranged in a first direction, and
the overheat protection circuit is arranged between, at one end, the power device and, at another end, the controller and the pre-driver as viewed in a second direction perpendicular to the first direction.

* * * * *